(12) United States Patent
Ushimaru et al.

(10) Patent No.: US 11,049,758 B2
(45) Date of Patent: Jun. 29, 2021

(54) SUBSTRATE PLACING APPARATUS AND SUBSTRATE PLACING METHOD

(71) Applicant: Tokyo Electron Limited, Tokyo (JP)

(72) Inventors: Koji Ushimaru, Koshi (JP); Masashi Itonaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/390,079

(22) Filed: Apr. 22, 2019

(65) Prior Publication Data

US 2019/0326150 A1 Oct. 24, 2019

(30) Foreign Application Priority Data

Apr. 23, 2018 (JP) .............................. JP2018-082535

(51) Int. Cl.
*H01L 21/683* (2006.01)
*H01L 21/687* (2006.01)
*B25B 11/00* (2006.01)

(52) U.S. Cl.
CPC ........ *H01L 21/6838* (2013.01); *B25B 11/005* (2013.01); *H01L 21/6875* (2013.01)

(58) Field of Classification Search
CPC ............... B23B 31/307; H01L 21/6875; H01L 21/6838; H01L 21/67748; B25B 11/005; Y10T 279/11; Y10T 29/53191; Y10T 29/49998
See application file for complete search history.

(56) References Cited

U.S. PATENT DOCUMENTS

| 5,564,682 A * | 10/1996 | Tsuji | ..................... B25B 11/005 269/21 |
| 6,862,080 B2 * | 3/2005 | Matsui | ..................... G03F 7/707 355/72 |
| 8,138,456 B2 * | 3/2012 | Fukuda | ............. H01L 21/67748 219/497 |
| 8,186,077 B2 * | 5/2012 | Kawaji | ............. H01L 21/67109 34/304 |
| 10,153,185 B2 * | 12/2018 | Du Bois | .......... H01L 21/68792 |
| 2018/0082880 A1 * | 3/2018 | Komine | .............. H01L 21/6838 |
| 2018/0286772 A1 * | 10/2018 | Yamamoto | ............ B23B 31/307 |
| 2019/0164803 A1 * | 5/2019 | Wu | .................... H01L 21/67248 |

FOREIGN PATENT DOCUMENTS

JP 2017-199790 A 11/2017

* cited by examiner

*Primary Examiner* — Chwen-Wei Su
(74) *Attorney, Agent, or Firm* — Pearne & Gordon LLP

(57) ABSTRACT

A substrate can be placed on a placing table horizontally. When placing the substrate on the placing table having multiple protrusions configured to support the substrate, the substrate is attracted to the placing table while performing a suction from a suction hole configured to attract a position, different from positions located above the protrusions, of the substrate placed on the placing table, and then, a suction force of the suction hole is reduced. Accordingly, it is possible to place the substrate on the placing table while correcting the flexure. Further, the substrate can be horizontally placed on the placing table since deformation of the wafer, caused by attracting a bottom surface of the wafer strongly, is suppressed.

12 Claims, 14 Drawing Sheets

SUBSTRATE PLACING APPARATUS AND SUBSTRATE PLACING METHOD

CROSS-REFERENCE TO RELATED APPLICATION

This application claims the benefit of Japanese Patent Application No. 2018-082535 filed on Apr. 23, 2018, the entire disclosure of which is incorporated herein by reference.

TECHNICAL FIELD

The various aspects and embodiments described herein pertain generally to a substrate placing apparatus and a substrate placing method.

BACKGROUND

In a semiconductor manufacturing process, for example, a substrate such as a semiconductor wafer (hereinafter, simply referred to as "wafer") is horizontally placed on a placing table, and a processing such as a heating processing or a cooling processing is performed on the wafer.

Patent Document 1 discloses a vacuum attracting member configured as such a placing table for the substrate. This vacuum attracting member includes: an annular protruding portion provided at a base body facing a rear surface of the substrate and configured to support a peripheral portion of the substrate; and a multiple number of pins (protrusions) arranged in a region of the base body surrounded by the annular protruding portion and each configured to support the rear surface of the substrate. Further, also provided at the base body are a suction hole facing a central portion of the rear surface of the substrate and an annular protrusions (annular partition wall portions) concentrically provided around the suction hole. It is deemed that attraction of the substrate to the base body and flattening of the substrate are achieved by Bernoulli's phenomenon which is generated between the respective annular protrusions and the substrate as a result of performing a suction through the suction hole.

Patent Document 1: Japanese Patent Laid-open Publication No. 2017-199790

SUMMARY

In view of the foregoing, exemplary embodiments provide a technique of placing a substrate on a placing table such that flatness of the substrate is increased.

In an exemplary embodiment, a substrate placing apparatus includes a placing table configured to place a substrate thereon; multiple protrusions provided on a surface of the placing table and configured to support the substrate; a suction hole opened at a position on the surface of the placing table different from positions where the multiple protrusions are provided, and configured to attract a bottom surface of the substrate placed on the placing table; and a control unit configured to output a control signal to allow a first process of attracting the substrate, which is placed on the placing table, to the placing table by performing a suction from the suction hole and a second process of attracting the substrate to the placing table by setting a suction force acting on the substrate to be smaller than a suction force acting on the substrate in the first process to be performed.

According to the exemplary embodiment, it is possible to place the substrate on the placing table horizontally.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
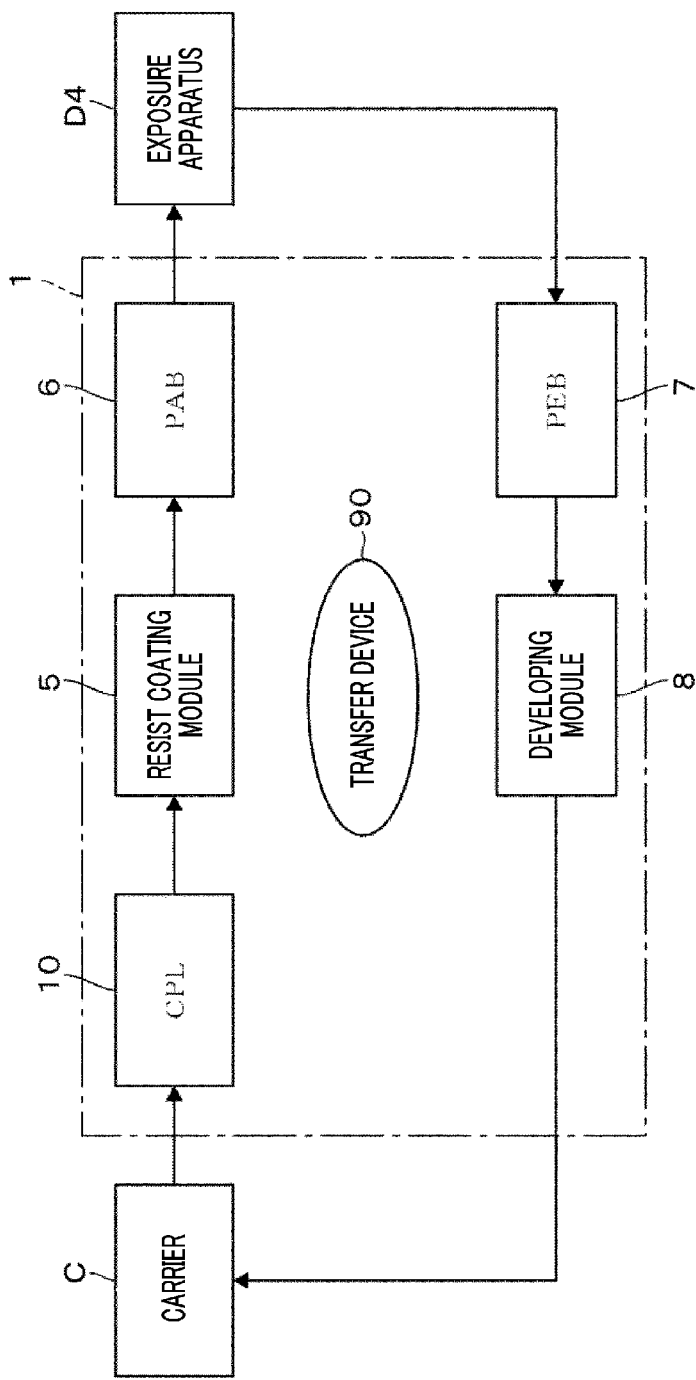
FIG. 1 is a flowchart illustrating a sequence of a processing upon a wafer in a coating and developing apparatus.

In the following detailed description, reference is made to the accompanying drawings, which form a part of the description. In the drawings, similar symbols typically identify similar components, unless context dictates otherwise.

Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a cooling apparatus 10 as an example where a substrate placing apparatus according to an exemplary embodiment is applied to a cooling apparatus CPL will be explained. First, a coating and developing apparatus 1 accommodating the cooling apparatus 10 therein will be briefly explained with reference to FIG. 1. A wafer as a circular substrate accommodated in a carrier C is transferred into the cooling apparatus 10 by a transfer device 90 and then, is cooled such that a temperature of the wafer is uniform within a surface thereof. Then, the wafer is transferred into a resist coating module 5, and then, a resist film is formed as a resist is coated on the wafer by spin coating. To allow this resist coating to be performed uniformly within the surface of the wafer, cooling by the cooling apparatus 10 is performed. The wafer coated with the resist is then transferred into a pre-applied bake apparatus (PAB) 6 and subjected to a heating processing (pre-bake processing), so that a solvent in the resist film is removed.

Subsequently, the wafer after being subjected to the pre-bake processing is transferred into an exposure apparatus D4, and an exposure processing is performed. Upon the completion of the exposure processing, the wafer is returned back into the coating and developing apparatus 1 and subjected to a heating processing in a post-exposure bake apparatus (PEB) 7. Then, a developing processing of the resist film is performed in a developing module 8, and the wafer is returned back into the carrier C.

Figure 2:
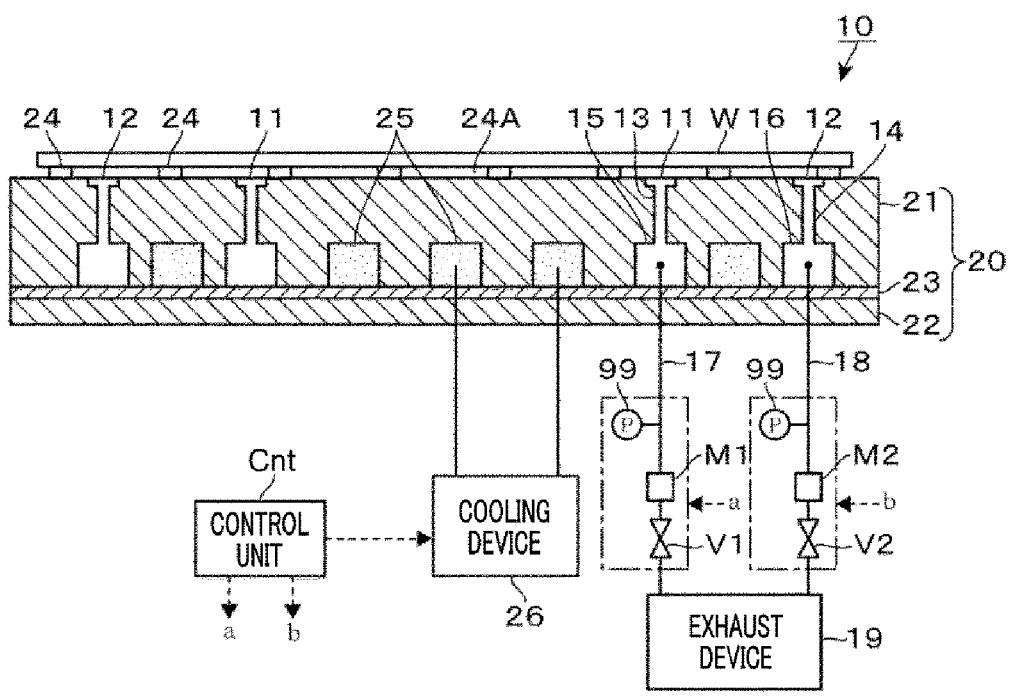
FIG. 2 is a longitudinal cross sectional view of a cooling apparatus according to an exemplary embodiment.
Figure 3:
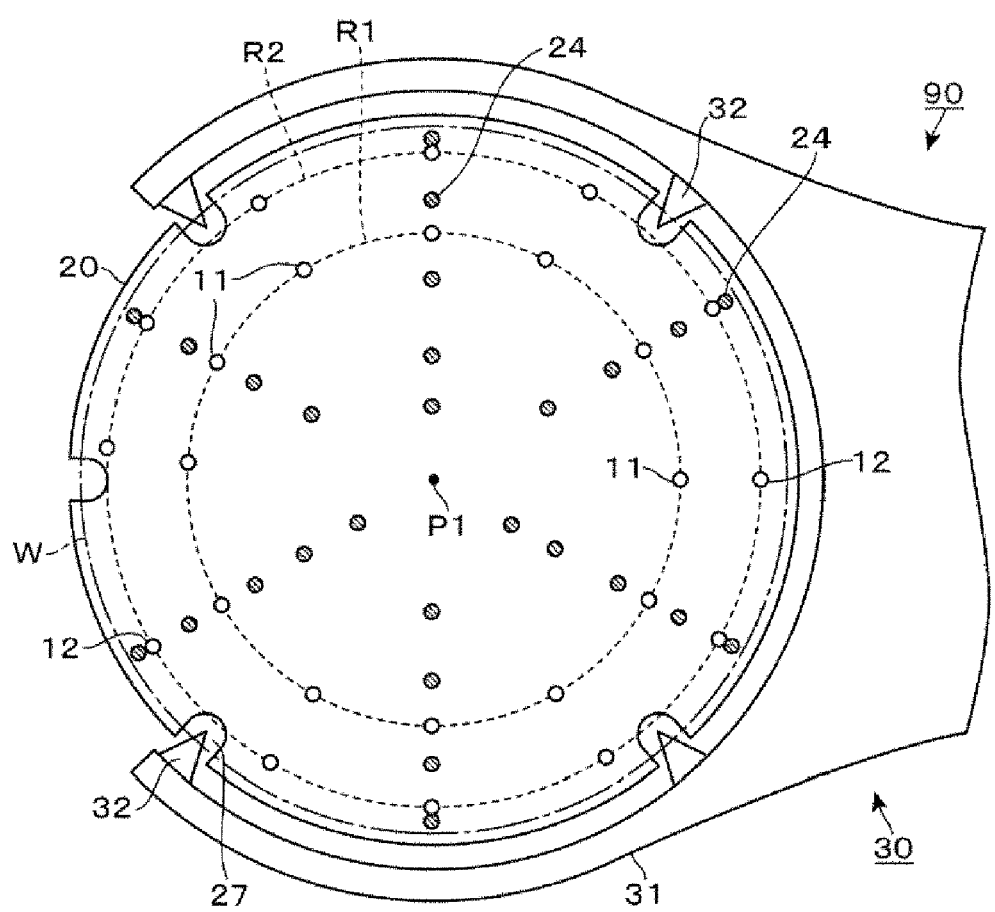
FIG. 3 is a plan view of the cooling apparatus according to the exemplary embodiment.

Now, the aforementioned cooling apparatus 10 will be described. FIG. 2 and FIG. 3 provide a longitudinal cross sectional view and a plan view of the cooling apparatus 10, respectively. The cooling apparatus 10 is equipped with a substantially circular plate-shaped placing table 20 on which the wafer W is horizontally placed. The placing table 20 is composed of a bottom plate 22, a rubber plate 23 and a top plate 21 which are stacked in this sequence from the bottom. Multiple gap pins 24 as protrusions configured to support the wafer W are provided on a surface of the placing table 20 in a distributed manner. Since the wafer W is supported by these gap pins 24, a contact area between the wafer W and the placing table 20 becomes small and it is possible to attract the wafer W from positions different from the gap pins 24, as will be described later. With this configuration, when a suction force acting on the wafer W is reduced as will be described later, flexure of the wafer W can be more easily corrected. A height of each gap pin 24 is set to be in a range from, e.g., 0.05 mm to 0.1 mm inclusive. Further, a gap 24A is formed between a bottom surface of the wafer W and the surface of the placing table 20 by the gap pins 24. The wafer W is placed such that a center thereof coincides with a center position of the surface of the placing table 20 indicated by P1 in FIG. 3. Accordingly, this position P1 is a center of a substrate placing region, and the wafer W in FIG. 3 indicates the substrate placing region.

Further, first suction holes 11 and second suction holes 12 for attracting the bottom surface of the wafer W placed on the placing table 20 are provided at positions on the surface of the placing table 20 different from the positions where the gap pins 24 are provided. Each of the first suction holes 11 and the second suction holes 12 is opened vertically upwards. Individual regions (a first region and a second region) of the bottom surface of the wafer W respectively facing the first suction holes 11 and the second suction holes 12 are attracted. When viewed from the top, the first suction holes 11 are provided on a circumference centered around the center of the placing table 20, and the first suction holes 11 are equi-spaced on this circumference. Further, when the wafer W has a radius R, the first suction holes 11 are located, on the surface of the placing table 20, within an annular region between a circle, which is centered around the position P1 and has a radius of $\frac{1}{3} \times R$, and a circle, which is centered around the position P1 and has a radius of $\frac{2}{3} \times R$. Accordingly, the region of the wafer W between a position spaced apart from the center of the wafer W by a distance of $\frac{1}{3} \times R$ and a position spaced apart from the center of the wafer W by a distance of $\frac{2}{3} \times R$ is attracted. When viewed from the top, the second suction holes 12 are arranged on a circumference centered around the center P1 of the placing table 20 and located outer than the circumference on which the first suction holes 11 are provided. The second suction holes 12 are equi-spaced on the corresponding circumference. In FIG. 3, circles R1 and R2 respectively passing the first suction holes 11 and the second suction holes 12 are imaginary circles drawn to facilitate understanding of the arrangement of the first suction holes 11 and the second suction holes 12.

The first suction holes 11 are connected via a gas passage 13 extended downwards to a first suction path 15 which is formed in a ring shape along the arrangement direction of the first suction holes 11. One end of a first suction line 17 is connected to the first suction path 15, and the other end of the first suction line 17 is connected to an exhaust device 19 via a pressure gauge 99, a flow rate control unit M1 configured to adjust an exhaust rate in the first suction line 17 and a valve V1 in this sequence.

Further, the second suction holes 12 are connected via a gas passage 14 extended downwards to a second suction path 16 which is formed in a ring shape along the arrangement direction of the second suction holes 12. One end of a second suction line 18 is connected to the second suction path 16, and the other end of the second suction line 18 is connected to the exhaust device 19 via a pressure gauge 99, a flow rate control unit M2 and a valve V2. Each of the first suction path 15 and the second suction path 16 is formed by a groove formed in a bottom surface of the top plate 21 and a top surface of the rubber plate 23. The first suction path 15 and the second suction path 16 are isolated from each other. Accordingly, as the valves V1 and V2 are opened or closed, an on/off operation of the suction from the first suction holes 11 and the second suction holes 12 is switched, respectively. Further, in the present exemplary embodiment, the exhaust rate in the first suction line 17 during the suction from the first suction holes 11 and an exhaust rate in the second suction line 18 during the suction from the second suction holes 12 are maintained constant by the flow rate control unit M1 and the flow rate control unit M2, respectively.

Furthermore, the placing table 20 is equipped with a coolant path 25 which is isolated from the first suction path 15 and the second suction path 16. Like the first suction path 15 and the second suction path 16, the coolant path 25 is formed by a groove in the bottom surface of the top plate 21 and the rubber plate 23. The coolant path 25 is connected to a cooling device 26 such as, but not limited to, a chiller. By allowing a cooling medium such as cooling water to flow within the coolant path 25, the surface of the placing table 20 can be cooled to a uniform temperature.

In addition, notches 27 for a transfer of the wafer W between the placing table 20 and a transfer device 90 are provided at an edge portion of the placing table 20. As depicted in FIG. 3, the transfer device 90 is equipped with a holding unit 30 configured to hold the wafer W at a leading end thereof. The holding unit 30 is equipped with a substantially C-shaped portion 31. At an inner side of the C-shaped portion 31, four holding claws 32 are provided at four different positions where they hold the bottom surface of the peripheral portion of the wafer W.

The notches 27 are formed at positions respectively corresponding to the four holding claws 32, and each holding claw 32 passes through the corresponding notch 27 as the holding unit 30 is moved up and down. Accordingly, the wafer W is transferred between the placing table 20 and the holding unit 30.

Referring back to FIG. 2, the cooling apparatus 10 is equipped with a control unit Cnt. A program stored in a recording medium such as a compact disk, a hard disk, a MO (magneto-optical disk) and a memory card is installed to the control unit Cnt. The installed program transmits control signals for flowing the cooling medium by the cooling device 26, switching the on/off operation of the suction from the first suction holes 11 and the second suction holes 12 by opening and closing the valves V1 and V2, adjusting the exhaust rate by controlling the flow rate control units M1 and M2 and moving the holding unit 30 up and down in the cooling apparatus 10. Commands (individual processes: a process group) are provided to control an operation of the cooling device 10 to be described later.

Figure 4:
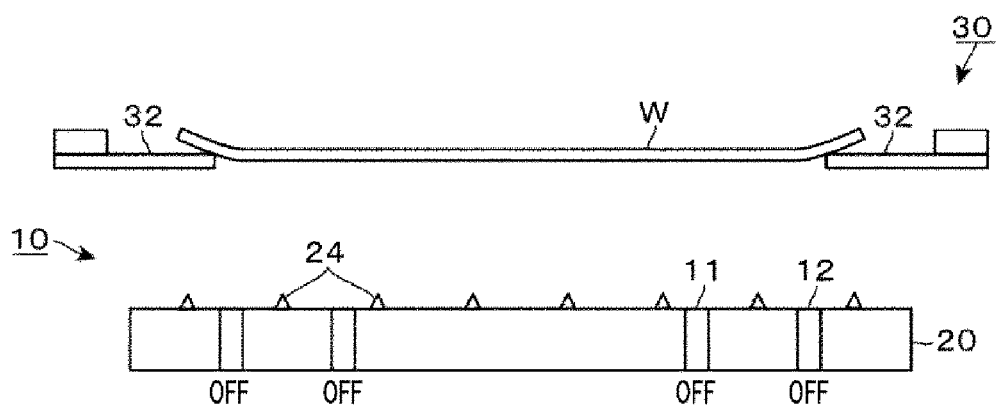
FIG. 4 is an explanatory diagram illustrating an operation of the cooling apparatus according to the exemplary embodiment.

The wafer W transferred to the cooling device 10 may be bent. FIG. 4 illustrates an example of the wafer W which is bent such that a peripheral portion thereof is higher than a central portion when it is placed on a horizontal plane. However, various bending states of the wafer W may be provided. Providing that the bent wafer W is supported on the gap pins 24 of the supporting table 20 and the cooling is performed in this state, distances between respective portions on the surface of the wafer W and the surface of the placing table 20 are differed, resulting in a failure to cool the wafer W uniformly within the entire surface thereof. As a consequence, the cooling may become non-uniform. That is, there is a concern that temperatures of the respective portions on the surface of the wafer W after being subjected to the cooling may be different. Further, with regard to the apparatus described in the aforementioned Patent Document 1, if the degree of the bending of the wafer W is large, the Bernoulli's effect may not be obtained as the distance between the wafer W and the placing table is largely increased. Thus, it is deemed to be difficult to place the wafer W while flattening the wafer W having such a large degree of the bending.

The above-described cooling apparatus 10 is operated to flatten the wafer W by correcting the bending of the wafer W placed on the placing table 20. Further, as will be stated later, this cooling apparatus 10 is operated to increase flatness of the wafer W by removing deformation of the wafer W. In the following description, operations of the cooling apparatus 10 will be explained.

First, as shown in FIG. 4, the wafer W held by the holding unit 30 is located above the placing table 20 which is cooled by a flow of the coolant. Further, the first suction holes 11 and the second suction holes 12 are in a stand-by state while stopping the suction.

Figure 5:
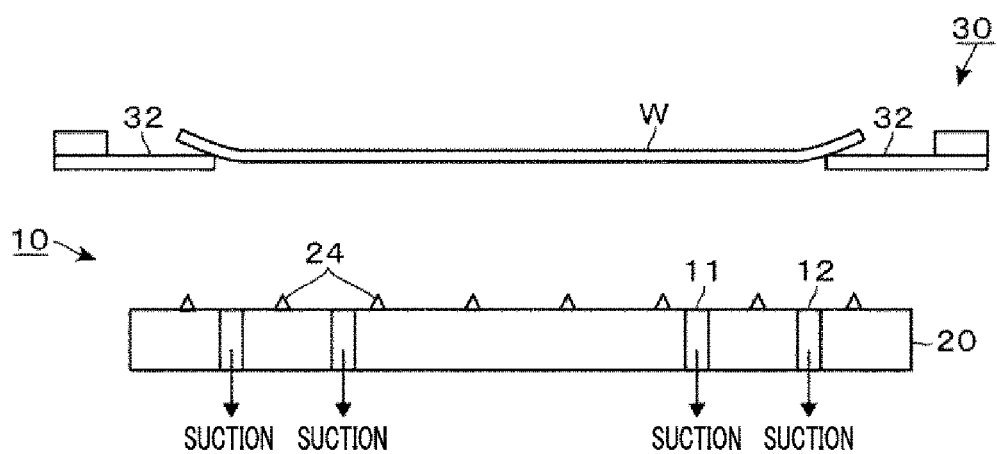
FIG. 5 is an explanatory diagram illustrating an operation of the cooling apparatus according to the exemplary embodiment.

Subsequently, as depicted in FIG. 5, suction is begun from each of the first suction holes 11 and the second suction holes 12. Then, the holding unit 30 is lowered to place the wafer W on the placing table 20 (specifically, on the gap pins 24).

Figure 6:
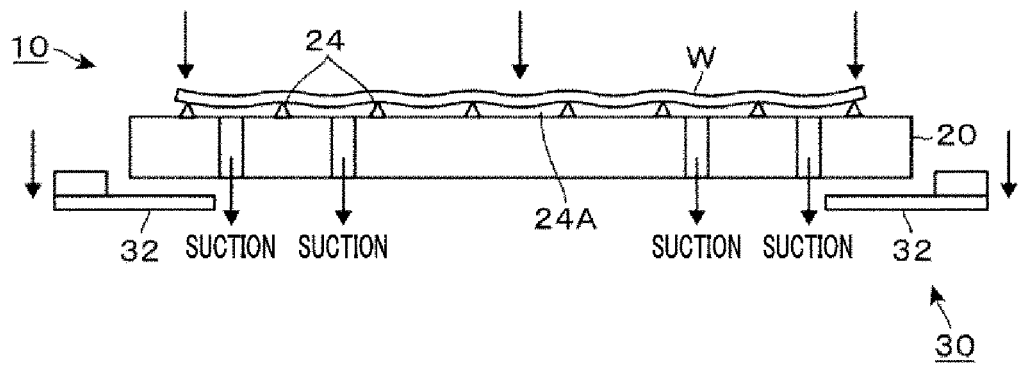
FIG. 6 is an explanatory diagram illustrating an operation of the cooling apparatus according to the exemplary embodiment.

Since the wafer W placed on the placing table 20 is attracted by the suction from the first suction holes 11 and the second suction holes 12 individually, a relatively strong suction force acts on the wafer W, so that the bending of the wafer W is corrected and the respective portions on the bottom surface of the wafer W come into firm contact with the gap pins 24. However, since the suction from the first suction holes 11 and the suction from the second suction holes 12 are performed individually as stated above, the pressure within the gap 24A between the bottom surface of the wafer W and the surface of the placing table 20 becomes a negative pressure with respect to a pressure within a region above the wafer W, and this pressure difference may be relatively large. Therefore, the portions within the surface of the wafer W which are not supported by the gap pins 24 are attracted toward the surface of the placing table 20 more strongly than the portions supported by the gap pins 24. As a result, the wafer W is distorted in a wave shape. That is, the wafer W suffers the deformation and the flexure (see FIG. 6).

Figure 7:
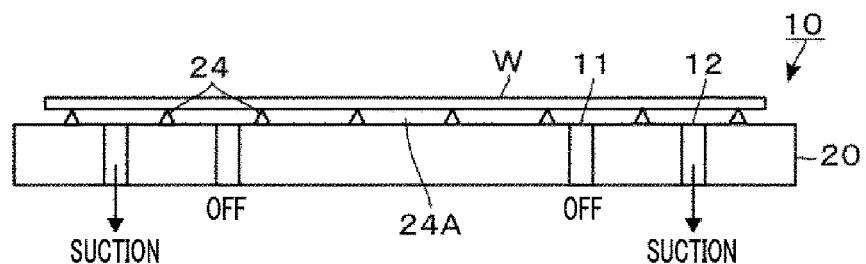
FIG. 7 is an explanatory diagram illustrating an operation of the cooling apparatus according to the exemplary embodiment.

Thereafter, as shown in FIG. 7, while carrying on the suction from the second suction holes 12, the suction from the first suction holes 11 is stopped. Accordingly, the pressure within the gap 24A is increased, and the difference between the pressure of the gap 24A and the pressure of the region above the wafer W is decreased. That is, as the suction force whereby the wafer W is attracted to the placing table 20 is weakened, the deformation of the wafer W is corrected and the wafer W is flattened. Further, since the bending of the wafer W is already corrected, the gap 24A is made to be relatively small. Accordingly, even if the suction from the first suction holes 11 is stopped and the suction is performed only from the second suction holes 12, while reducing the pressure of the gap 24A sufficiently, the respective portions within the surface of the wafer W can be attracted to the placing table 20 against a restoring force of the wafer W. Therefore, during the suction only through the second suction holes 12, the wafer W can be suppressed from being bent again. As stated above, since the wafer W becomes flattened, the wafer W is cooled in the state that the entire surface of the wafer W is equi-spaced from the placing table 20. Accordingly, non-uniformity in the cooling due to a difference in the distance from the placing table 20 is not caused within the surface of the wafer W, so that the wafer W can be cooled such that uniformity in the temperatures between the respective portions of the wafer W is improved.

Figure 8:
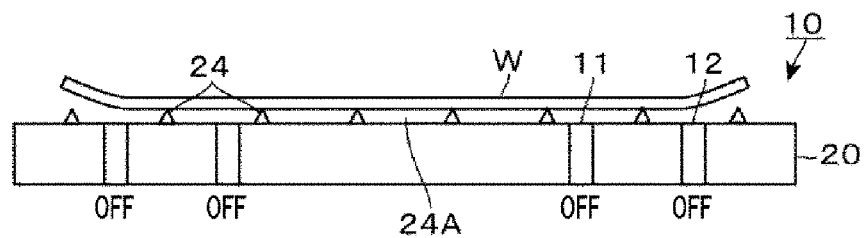
FIG. 8 is an explanatory diagram illustrating an operation of the cooling apparatus according to the exemplary embodiment.
Figure 9:
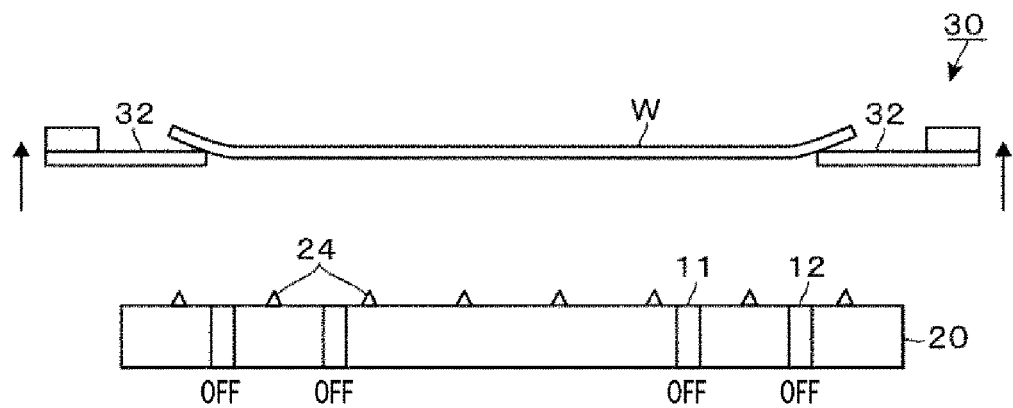
FIG. 9 is an explanatory diagram illustrating an operation of the cooling apparatus according to the exemplary embodiment.

Then, as depicted in FIG. 8, the suction from the second suction holes 12 is stopped. If the suction is not performed from the second suction holes 12 as well, the attraction force, which attracts the wafer W downwards, does not act on the wafer W, so that the wafer W is returned back into the state where it is bent. Then, as shown in FIG. 9, the wafer W on the placing table 20 is received by the holding unit 30 of the transfer device 90. Thereafter, the wafer W is transferred into the resist coating module 5 as stated above, and the resist coating processing is performed.

According to the above-described exemplary embodiment, when placing the wafer W on the placing table 20 of the cooling apparatus 10, the wafer W is placed on the placing table 20 in the state that the suction from the first suction holes 11 and the second suction holes 12 provided in the placing table 20 is performed. Then, while maintaining the suction from the second suction holes 12, the suction from the first suction holes 11 is stopped. Thus, the wafer W can be placed on the placing table 20 in the state that the bending thereof is corrected, and the deformation of the wafer W that might be caused by attracting the bottom surface of the wafer W strongly can be suppressed. Therefore, it is possible to place the wafer W on the placing table 20 while achieving high flatness of the wafer W.

Now, the reason for stopping the suction from the first suction holes 111, in the first suction holes 11 opened at the center side of the placing table 20 and the second suction holes 12 opened at the peripheral side of the placing table 20, will be explained. Assume that the wafer W, which is bent such that the peripheral portion thereof is higher than the central portion (referred to as "upwardly bent wafer W") as shown in FIG. 4, is placed on the placing table 20 and the bending is corrected by the suction from the first suction holes 11 and the second suction holes 12 as stated above. As this wafer is originally bent in this way, the restoring force of the peripheral portion of this wafer is large when the bending is corrected on the placing table 20. Accordingly, if the suction force acting on the peripheral portion of this wafer W is largely reduced, the peripheral portion of the wafer W may be lifted from the gap pins 24 due to the restoring force, so that the height of the gap 24A under this peripheral portion is increased, and a gas may easily enter a space under the wafer W from the vicinity of the wafer W. As a consequence, there occurs a concern that the pressure within the gap 24A is increased and the wafer W is bent again. That is, to continuously attract the peripheral portion of the upwardly bent wafer W to the gap pins 24 of the placing table 20, it is required to allow the large suction force to act on the corresponding peripheral portion continuously. Thus, it is effective to keep on attracting the peripheral portion of the wafer W by carrying on the suction from the second suction holes 12.

To the contrary, assume that the wafer W which is bent such that the peripheral portion thereof is lower than the central portion thereof (referred to as "downwardly bent wafer W") is placed on the placing table 20 and the bending of the wafer W is corrected by performing the suction through the first suction holes 11 and the second suction holes 12. In this case, if the suction force acting on the central portion of the downwardly bent wafer W is largely decreased, the central portion of this wafer W is deemed to be lifted from the gap pins 24 by the restoring force. However, even if the central portion of the wafer W is lifted, an inflow of the gas into the space under the wafer W from the vicinity of the wafer W is suppressed as the peripheral portion of the wafer W is adjacent to the placing table 20. Therefore, the increase of the pressure in the gap 24A is suppressed, and the respective portions within the surface of the wafer W is continuously attracted toward the placing table 20. Thus, it is deemed that such a lift of the central portion of the wafer W is actually suppressed, and the wafer W would be held on the placing table 20 in the state that the bending thereof is still corrected.

That is, by stopping the suction through the first suction holes 11 in the first suction holes 11 and the second suction holes 12, there is obtained an advantage that it is possible to maintain the state where the bending of the wafer W, whether the wafer W is upwardly bent or downwardly bent, is corrected by allowing the appropriate suction force to act on the wafer W while the flexure of the wafer W is suppressed. Further, in the apparatus described in the aforementioned Patent Document 1, since the distance between the center portion of the wafer and the placing table is large when attracting the upwardly bent wafer, it is difficult to attract the central portion. Further, the peripheral portion of the wafer might be attracted prior to the central portion thereof. If, however, the peripheral portion of the wafer is first attracted, it is deemed that the central portion of the wafer, which is attracted to the placing table later, may be easily bent.

Further, a bending amount of the wafer W placed on the placing table 20 may be relatively large, for example, equal to or less than 500 μm, and the bending of the wafer W having such a large bending amount can be corrected on the placing table 20. Here, the bending amount is a difference between a bottommost portion and a topmost portion of the wafer W, and may be mostly generated by the height difference between the center and the peripheral portion of the wafer W.

Further, the process performed after the wafer W is placed on the placing table 20 while performing that the suction from the suction holes 11 and the second suction holes 12 is not limited to stopping the suction from the first suction holes 11 while carrying on the suction from the second suction holes 12. In the state that the suction from the second suction holes 12 is performed, a suction amount of the first suction holes 11 may be reduced to have a value larger than zero (0). That is, since the deformation and the flexure of the wafer W can be suppressed by suppressing the decrease of the pressure of the space under the wafer W as stated above, the suction through the first suction holes 11 may not need to be stopped.

Here, an exhaust amount from the first suction holes 11 needs to be reduced to be smaller than an exhaust amount from the second suction holes 12. That is, an operation of the flow rate control unit M1 may be controlled such that the suction force by the first suction holes 11 is reduced to be smaller than the suction force by the second suction holes 12.

Furthermore, after placing the wafer W on the placing table 20 in the state that the suction from the first suction holes 11 and the suction from the second suction holes 12 are performed, while reducing the suction force of the first suction holes 11, the suction force of the second suction holes 12 may also be reduced.

As stated above, since the first suction holes 11 and the second suction holes 12 are distributed to be arranged along the circumferential direction of the placing table 20, regions of the wafer W corresponding to the circumferences thereof are attracted. As these regions corresponding to the circumferences are attracted, the suction force can be made to be uniform at the respective portions within the surface of the wafer W in the circumferential direction. Therefore, the wafer W can be flattened more securely.

In addition, the regions of the wafer W corresponding to the circumferences thereof, which are respectively attracted by the suctioning from the first suction holes 11 and the second suction holes 12, are concentric regions centered around the center of the wafer W. This configuration in which these concentric regions are attracted is desirable as it is easy to adjust the suction force for the individual portions within the surface of the wafer W which are distanced apart from each other in the diametrical direction. Further, this configuration is also desirable in that the wafer W can be flattened more securely.

However, it should be noted that the exemplary embodiment is not limited to arranging the first suction holes 11 in a row and the second suction holes 12 in a row to attract the concentric regions.

Figure 10:
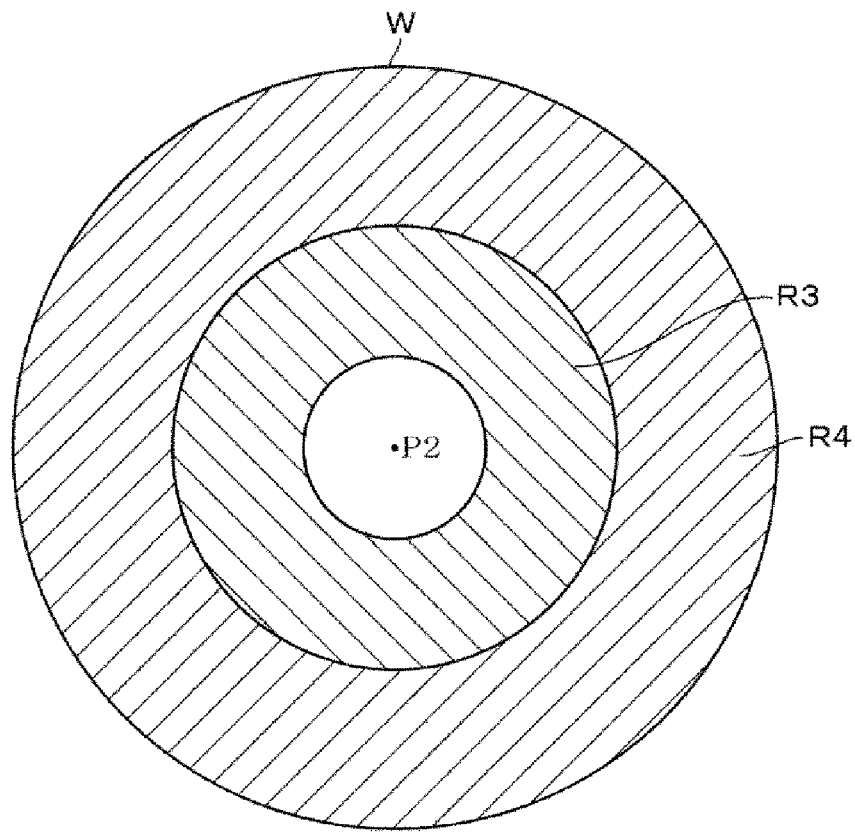
FIG. 10 is a plan view illustrating another example substrate placing apparatus according to the exemplary embodiment.

To elaborate, assume that concentric regions R3 and R4 centered around a center P2 of the wafer W are respectively set on the bottom surface of the wafer W placed on the placing table 20, as shown in FIG. 10. The regions R3 and R4 are rings which are not overlapped with each other and have a wide width. Further, assume that five or more of the first suction holes 11 and five or more of the second suction holes 12 are arranged along the circumferential direction of the wafer W. If the first suction holes 11 are opened to face one of the region R3 or the region R4 and the second suction holes 12 are opened to face the other of the region R3 or the region R4, this configuration is also included in the configuration where the first suction holes 11 and the second suction holes 12 perform the suction on the concentric regions. Further, the first suction holes 11 and the second suction holes 12 may have a slit shape. Further, the first suction holes 11 and the second suction holes 12 may be formed as ring-shaped slits individually, and concentric regions centered around the center P2 may be attracted.

Figure 11:
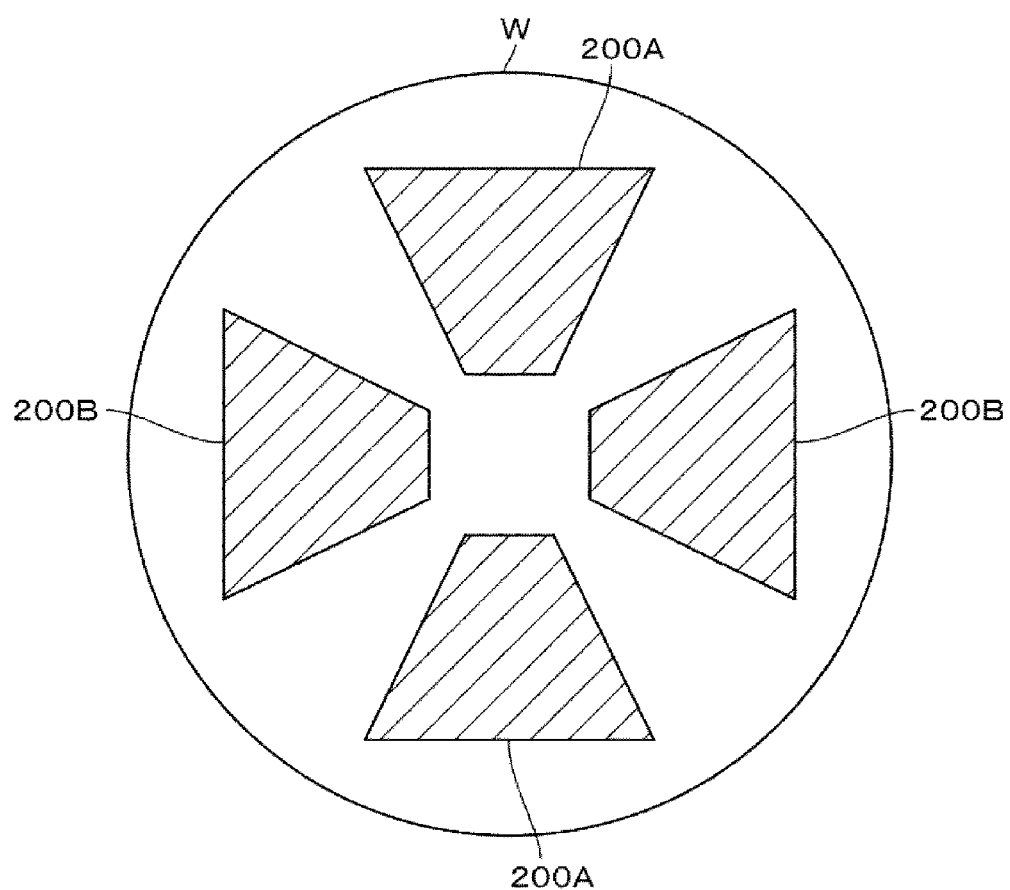
FIG. 11 is a plan view illustrating yet another example substrate placing apparatus according to the exemplary embodiment.

In addition, the exemplary embodiment is not merely limited to the configuration where the first suction holes 11 perform the suction on the more central side of the wafer W than the second suction holes 12. Depending on the bending and the flexure of the wafer W, the first suction holes 11 may be configured to perform the suction on a more peripheral side of the wafer W than the second suction holes 12. Furthermore, the first suction holes 11 and the second suction holes 12 may not be arranged in the diametrical direction of the wafer W. FIG. 11 illustrates regions 200A where the first suction holes are provided and regions 2008 where the second section holes are provided on the surface of the placing table 20. As depicted in FIG. 11, the regions 200A and 200B may be alternately arranged along the circumferential direction of the placing table 20. Further, though two regions 200A and two regions 200B are provided in FIG. 11, a larger number of regions 200A and 200B may be provided.

Moreover, the above description has been provided for the example where the two groups of the suctions holes, the suction force of which can be controlled altogether, are provided. However, only one group may be provided. By way of example, after the wafer W is transferred onto the placing table 20, the wafer W is attracted to the placing table 20 by performing the suction on the rear surface of the wafer W by this single group. Then, the suction force by this single group is reduced. Before the wafer W is attracted to the placing table 20, a large suction force is required because the distance between the wafer W and the suction holes is long. After the wafer W is attracted to the placing table 20, however, since the bending of the wafer W is already resolved, the aforementioned gap 24A is relatively small. Thus, even if the suction force is reduced, the wafer W can be suppressed from being bent again.

By reducing the suction force as stated above, application of an unnecessary correcting force to the wafer W can be avoided. Accordingly, a non-uniform distribution of a stress at the respective portions within the surface of the wafer W, which may cause the flexure of the wafer W, is suppressed, so that the flexure can be corrected.

Figure 12:
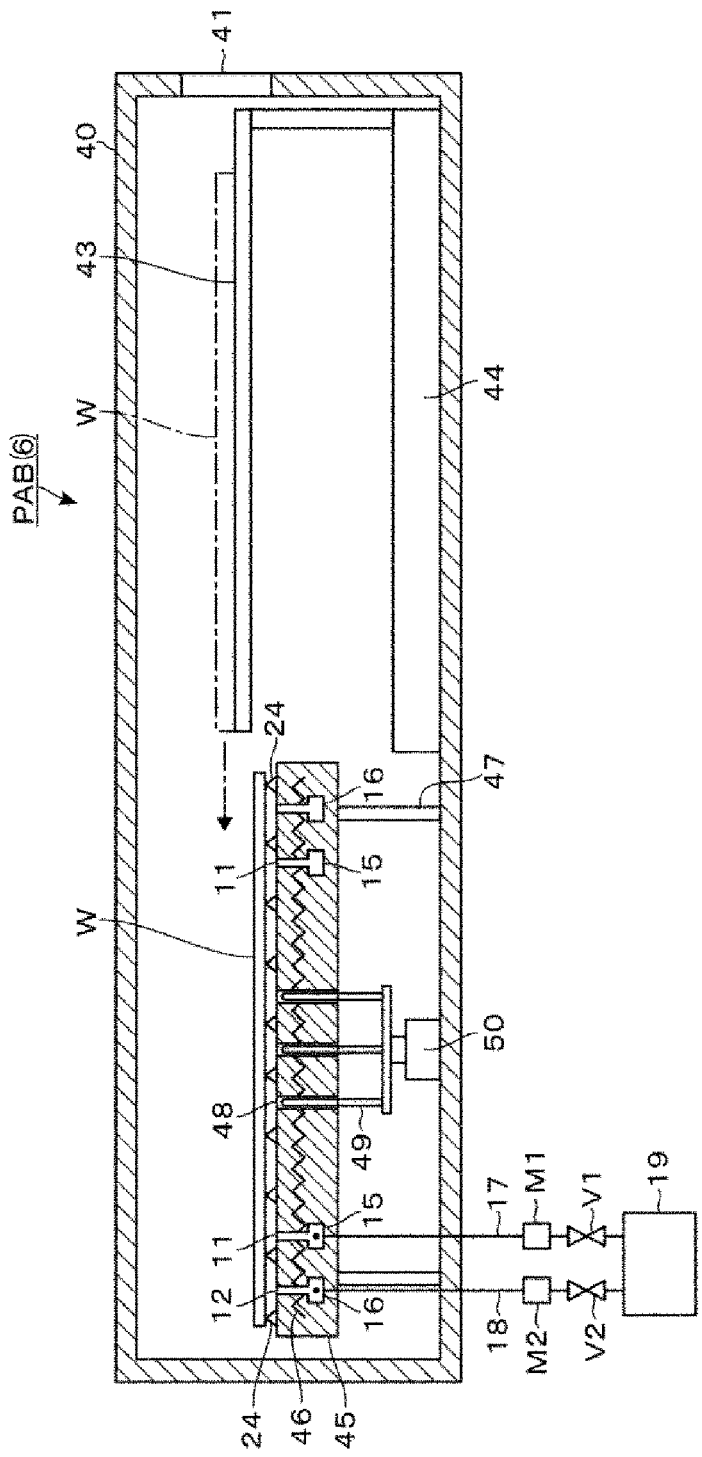
FIG. 12 is a longitudinal cross sectional view of PAB according to the exemplary embodiment.

Further, the aforementioned substrate placing apparatus may be applicable to a heating apparatus such as PAB 6 or PEB 7 shown in FIG. 1. An example where the substrate placing apparatus is applied to the PAB 6 will be explained with reference to FIG. 12 and FIG. 13. FIG. 12 is a longitudinal cross sectional view of the PAB 6. The PAB 6 is equipped with a housing 40, and a reference numeral 41 denotes a transfer opening for the wafer W which is provided at a sidewall of the housing 40.

Figure 13:
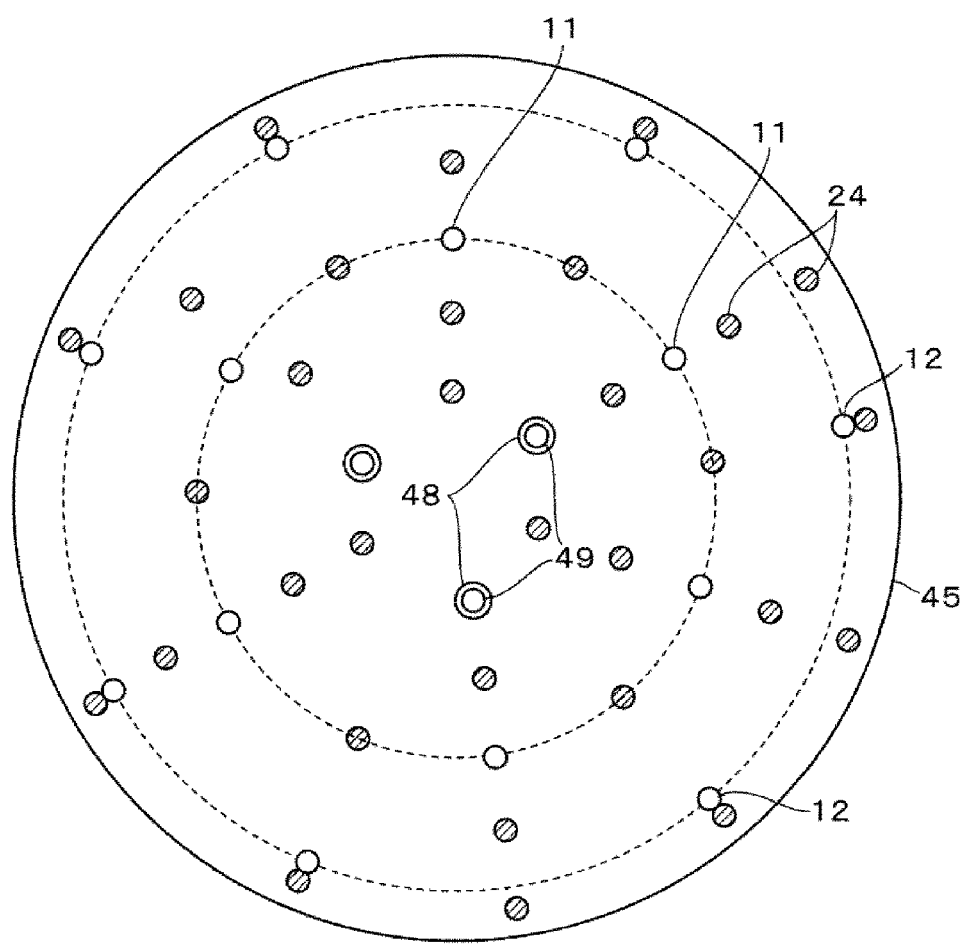
FIG. 13 is a plan view of the PAB according to the exemplary embodiment.

When viewed from the transfer opening 41, a placing table 45 configured to place the wafer W thereon horizontally is provided at an inner side within the housing 40. The placing table 45 has the substantially same configuration as the placing table 20. Here, only distinctive features from the placing table 20 will be discussed. Further, FIG. 13 is a top view of the placing table 45. A heater 46 configured to heat the wafer W placed on the placing table 45 is provided in the placing table 45.

Further, the placing table 45 is provided with through holes 48 which are arranged at a regular distance therebetween in a circumferential direction, and each through hole 48 is provided with an elevating pin 49. The elevating pins 49 are moved up and down by an elevating device 50 provided on a bottom surface of the housing 40 to be protruded from and retracted below a surface of the placing table 45.

Further, a cooling plate 43, which is configured to place thereon the wafer W after being heated and configured to cool the wafer W, is provided at a front side within the housing 40 when viewed from the transfer opening 41. The cooling plate 43 is horizontally moved between a standby position shown in FIG. 12 and a position above the placing table 45 by a moving device 44, and relays the transfer of the wafer W between a transfer device 90 of a unit block E3 and the placing table 45.

As the transfer device 90 is moved up and down with respect to the cooing plate 43 placed at the standby position, the wafer W is transferred between the transfer device 90 and the cooling plate 43. Further, the wafer W is transferred between the placing table 45 and the cooling plate 43 by the elevation of the elevating pins 49 and the movement of the cooling plate 43 in cooperation.

When placing the wafer W on the placing table 45, the elevating pins 49 supporting the wafer W are lowered in the state that the suction is performed from both the first suction holes 11 and the second suction holes 12. Then, the suction from the first suction holes 11 is stopped. Accordingly, the wafer W can be heated with high uniformity in a highly flat state. Further, the substrate placing apparatus of the present disclosure may be applied to the cooling plate 43.

Further, the substrate placing apparatus of the present disclosure may start the suction before or after the wafer W is placed on the placing table. Further, the number of the groups of the suctions holes, whose suction force can be adjusted altogether, may be three or more. Furthermore, when applying the substrate placing apparatus to the heating apparatus, the heating apparatus may be of a type configured to heat the substrate by irradiating, for example, LED light to the substrate on the placing table from above. That is, there may be adopted a configuration in which the placing table is not equipped with a temperature control unit configured to adjust the temperature of the substrate.

Furthermore, the substrate placing apparatus of the present disclosure may be applied to a placing table provided at various other kinds of apparatuses without being limited to the cooling apparatus and the heating apparatus. By way of non-limiting example, the substrate placing apparatus of the present disclosure may be applied to a placing table configured to place a substrate thereon when an exposure processing is performed in an exposure apparatus. By being applied to the exposure apparatus, the substrate placing apparatus of the present disclosure is capable of suppressing a focus error.

Alternatively, the substrate placing apparatus of the present disclosure may be applied to a spin chuck configured to hold a substrate horizontally and rotate the substrate around a vertical axis in an apparatus configured to supply a coating liquid on the substrate by spin coating.

Figure 14:
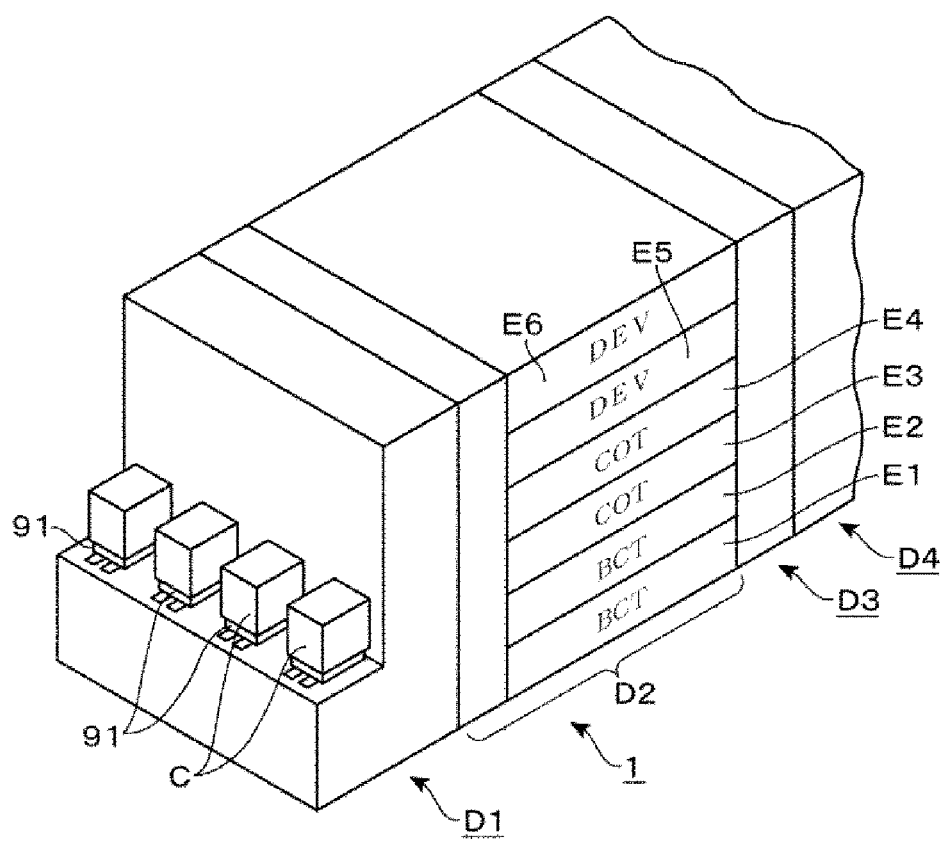
FIG. 14 is a perspective view illustrating a coating and developing apparatus.
Figure 15:
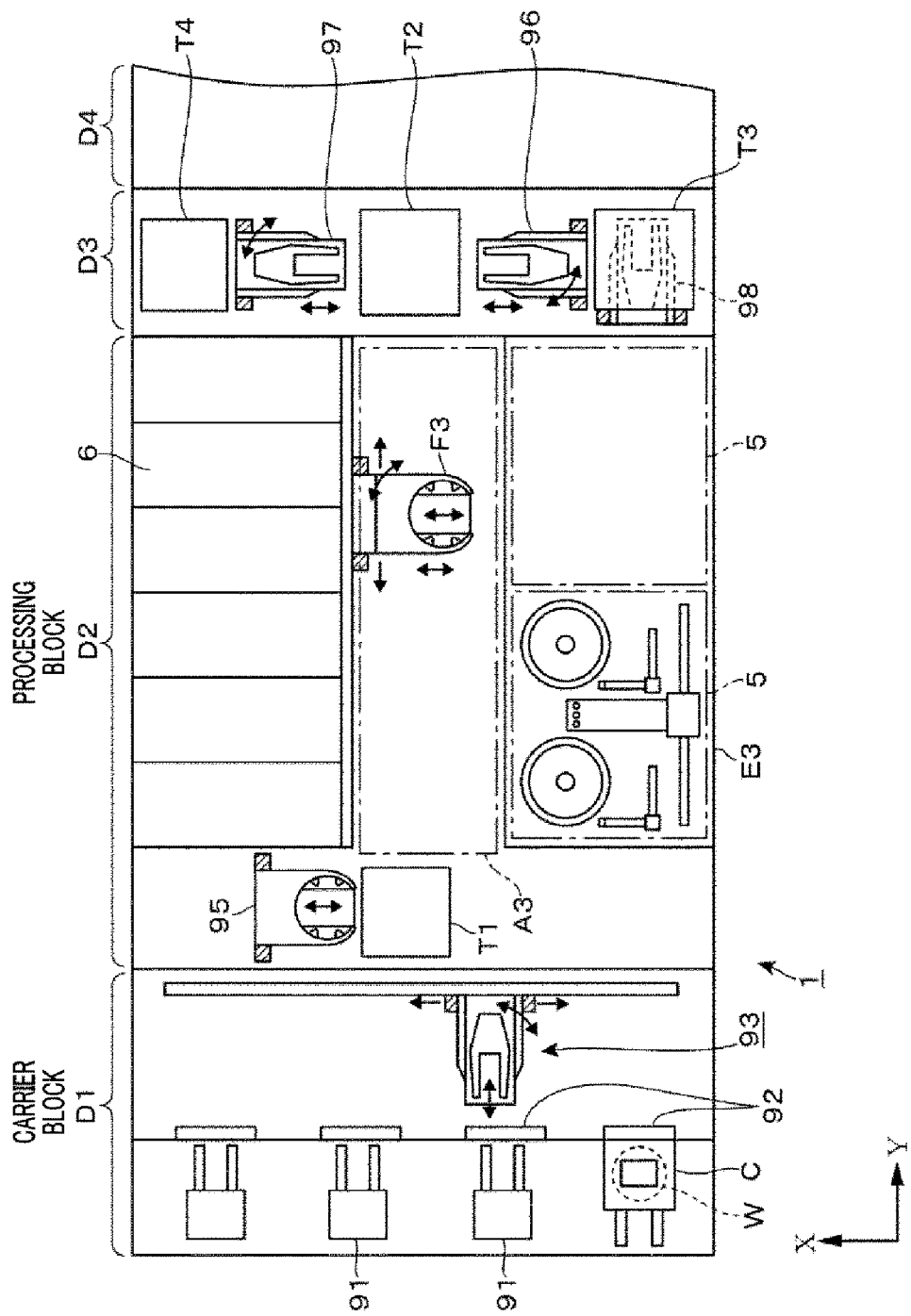
FIG. 15 is a plan view illustrating the coating and developing apparatus.
Figure 16:
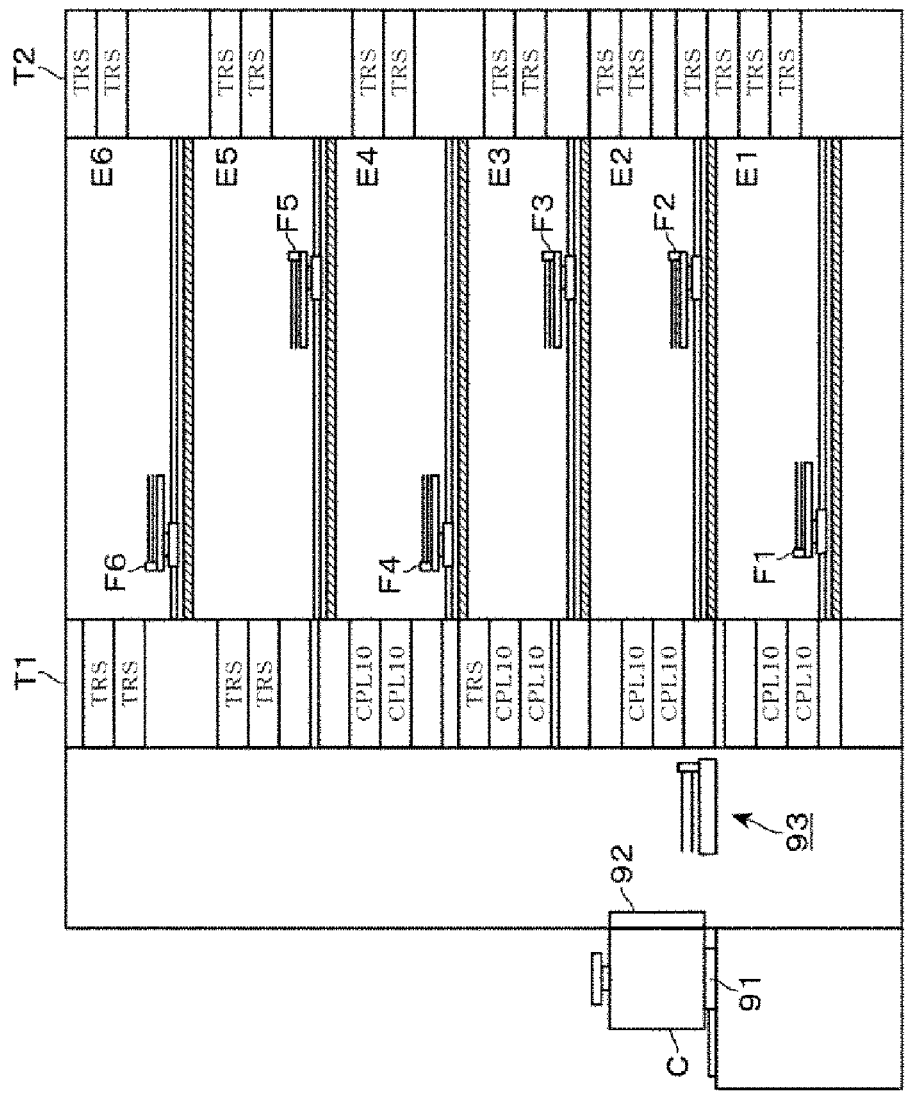
FIG. 16 is a longitudinal cross sectional view illustrating the coating and developing apparatus.

Now, a coating and developing apparatus 1 shown in FIG. 1 will be described in detail. FIG. 14, FIG. 15 and FIG. 16 are a perspective view, a plan view, and a schematic longitudinal side view of the coating and developing apparatus 1, respectively. This coating and developing apparatus 1 includes a carrier block D1, a processing block D2 and an interface block D3 which are connected in a straight line shape. An exposure apparatus D4 is connected to the interface block D3. In the following description, an arrangement direction of the blocks D1 to D3 is defined as a forward/backward direction. The carrier block D1 is configured to carry a carrier C into or out of the coating and developing apparatus 1, and equipped with a placing table 91 for the carrier C, an opening/closing unit 92 and a moving/placing device 93 configured to transfer the wafer W from the carrier C via the opening/closing unit 92.

The processing block D2 includes unit blocks E1 to E6, which are stacked on top of each other in sequence from the bottom and configured to perform liquid processings on the wafer W. For the convenience of explanation, a processing of forming a bottom antireflection film on the wafer W may be referred to as "BCT"; a processing of forming a resist film on the wafer W, "COT"; and a processing of forming a resist pattern on the wafer W after the wafer W is exposed, "DEV". In this example, two BCT layers, two COT layers and two DEV layers are stacked in sequence from the bottom, as shown in FIG. 14, and transfers and processings of wafers are performed in parallel in the same unit block.

Here, in the unit blocks, the COT layer E3 will be representatively explained with reference to FIG. 15. A plurality of PABs 6 is arranged in the forward-backward direction at one of the left side or the right sides of a transfer region A3 which is extended from the carrier block D1 toward the interface block D3, and resist coating modules 5 are provided at the other of the left side or the right side thereof.

The other unit blocks E1, E2, E5 and E6 have the same configuration as the unit blocks E3 and E4 except that a chemical liquid supplied to the wafer W is different. Each of the unit blocks E1 and E2 is equipped with an antireflection film forming module instead of the resist coating module 5, and each of the unit blocks E5 and E6 is equipped with a developing module 8 instead of the resist coating module 5. As depicted in FIG. 16, a tower T1 vertically extended along the unit blocks E1 to E6 and a vertically movable transit arm 95 configured to transfer the wafer W with respect to the tower T1 are provided at the carrier block D1 side within the processing block D2. Further, in FIG. 16, transfer arms of the unit blocks E1 to E6 are denoted by F1 to F6, respectively.

The tower T1 is composed of a multiple number of modules stacked on top of each other, and these modules provided at the same heights as the unit blocks E1 to E6 are configured to transfer wafers W to/from the transfer arms F1 to F6 of the unit blocks E1 to E6, respectively. The modules provided in this tower T1 include, for example, cooling devices (cooling modules) 10 provided at the height positions corresponding to the unit blocks E1 to E4. Further, transit modules TRS are provided at the height positions corresponding to the unit blocks E5 and E6.

The interface block D3 includes towers T2, T3 and T4 vertically extended along the unit blocks E1 to E6. The wafer W is transferred with respect to the towers T2 and T3 by a vertically movable interface arm 96, and the wafer W is transferred with respect to the towers T2 and T4 by a vertically movable interface arm 97. Further, there is also provided an interface arm 98 configured to transfer the wafer W between the tower T3 and the exposure apparatus D4.

The tower T2 includes transit modules TRS and so forth, and these modules are stacked on top of each other. Further, although modules are also provided in the towers T3 and T4, illustration of these modules will be omitted herein.

Further, the moving/placing device 93, the transit arm 95, the transfer arms F1 to F6, the interface arm 96, the interface arm 97 and the interface arm 98 are indicated as the transfer device 90 in FIG. 1.

In this coating and developing apparatus 1, the wafer W carried by the carrier C is sent into the processing block D2, and then, is transferred to the antireflection film forming (BCT) layer E1 (E2) and the resist film forming (COT) layer E3 (E4) in this order. Thereafter, the wafer W is carried into the exposure apparatus D4 via the interface block D3, and subjected to a preset exposure processing. After the preset exposure processing is performed in the exposure apparatus D4, the wafer W is returned back into the processing block D2. This returned wafer W is subjected to a developing processing in the unit block E5 (E6) (DEV layer) so that a pattern mask is formed thereon. Then, the wafer W is returned back into the carrier C.

Figure 17:
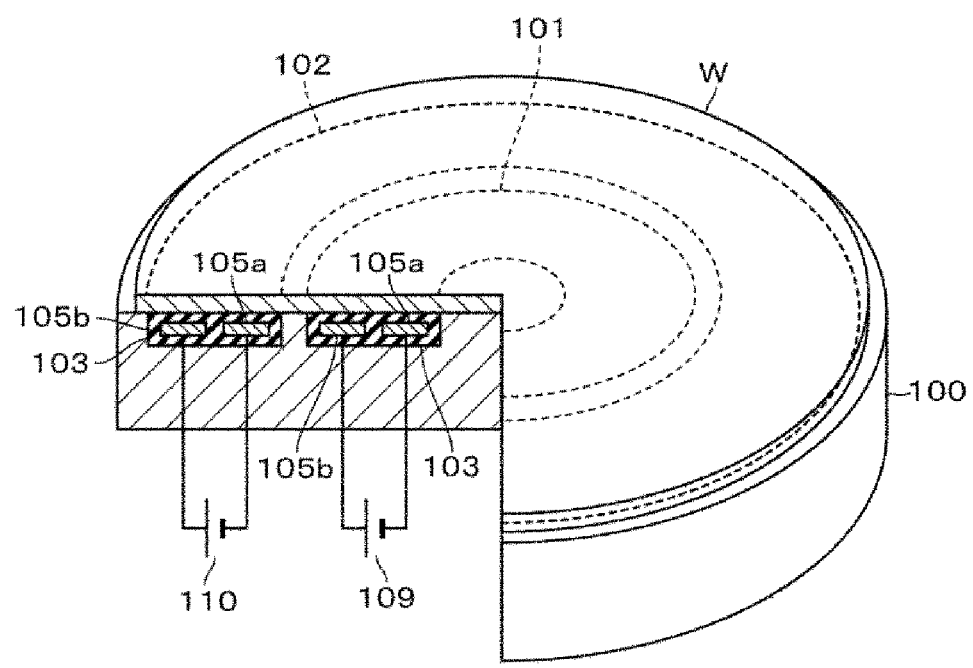
FIG. 17 is a cross sectional perspective view illustrating still yet another example substrate placing apparatus according to the exemplary embodiment.

Furthermore, the substrate placing apparatus may be configured to attract the wafer by an electrostatic chuck. FIG. 17 is a perspective view of a placing table 100 provided with an electrostatic chuck, and a cross section of a part thereof is also illustrated. A first electrostatic chuck 101 and a second electrostatic chuck 102 are provided in a surface of the placing table 100 having a circular shape. Each of the first electrostatic chuck 101 and the second electrostatic chuck 102 is formed in a circular ring shape around the center of the wafer W placed on the placing table 100. The first electrostatic chuck 101 is provided at a center side of the placing table 100, and the second electrostatic chuck 102 is provided at a peripheral side of the placing table 100.

The first and second electrostatic chucks 101 and 102 is respectively equipped with an insulating member 103, and circular ring-shaped attracting electrodes 105a and 105b having diameters different from each other are embedded in the insulating member 103 while being spaced apart from each other in a diametrical direction of the placing table 100. The attracting electrode 105a and the attracting electrode 105b of the first electrostatic chuck 101 are connected to a cathode and an anode of a DC power supply 109, respectively. The attracting electrode 105a and the attracting electrode 105b of the second electrostatic chuck 102 are connected to a cathode and an anode of a DC power supply 110, respectively.

Attraction of the wafer W by the first electrostatic chuck 101 will be explained. In the state that the wafer W is placed on the insulating member 103, the DC power supply 109 is turned on, and a first portion of the bottom surface of the wafer W, facing the attracting electrode 105a, and a second portion of the bottom surface of the wafer W, facing the attracting electrode 105b, are polarized to be positive and negative respectively, so that a Coulomb force acts. That is, the first portion is attracted to the attracting electrode 105a and the second portion is attracted to the attracting electrode 105b, so that the wafer W is attracted to the insulating member 103. Likewise, the wafer W is attracted to the second electrostatic chuck 102 as the DC power supply 110 is turned on.

Like the placing table 20, for example, this placing table 100 is configured such that a suction force acts on a central portion and a peripheral portion of the wafer W individually. That is, in an initial stage when the wafer W is placed, the attraction by the electrostatic chucks 101 and 102 is performed. Later, the DC power supply 109 of the electrostatic chuck 101 is turned off, and the attraction is performed only by the electrostatic chuck 102.

As discussed above, the above-described exemplary embodiment is not meant to be anyway limiting. The exemplary embodiment can be changed and modified in various ways without departing from the scope of the present disclosure.

EXPERIMENTAL EXAMPLES

Now, an experiment conducted regarding the present disclosure will be discussed. By using a cooling apparatus provided with the first suction holes 11 and the second suction holes 12, like the cooling apparatus 10 described in the exemplary embodiment, the suction is performed from the first suction holes 11 and the second suction holes 12 at a time $t_0$, and a wafer W held by the holding unit 30 is placed on the placing table 20 at a time $t_1$ (the time $t_1$ is when the wafer W comes into contact with the gap pins 24). Further, while carrying on the suction from the second suction holes 12, the suction from the first suction holes 11 is stopped at a time $t_2$, and this state in which the suction is performed only from the second suction holes 12 is maintained until a time $t_3$. In these series of operations for placing the wafer W, variations in height positions of the peripheral portion and the central portion of the wafer W are measured in a time range from the time $t_0$ to the time $t_3$.

Figure 18:
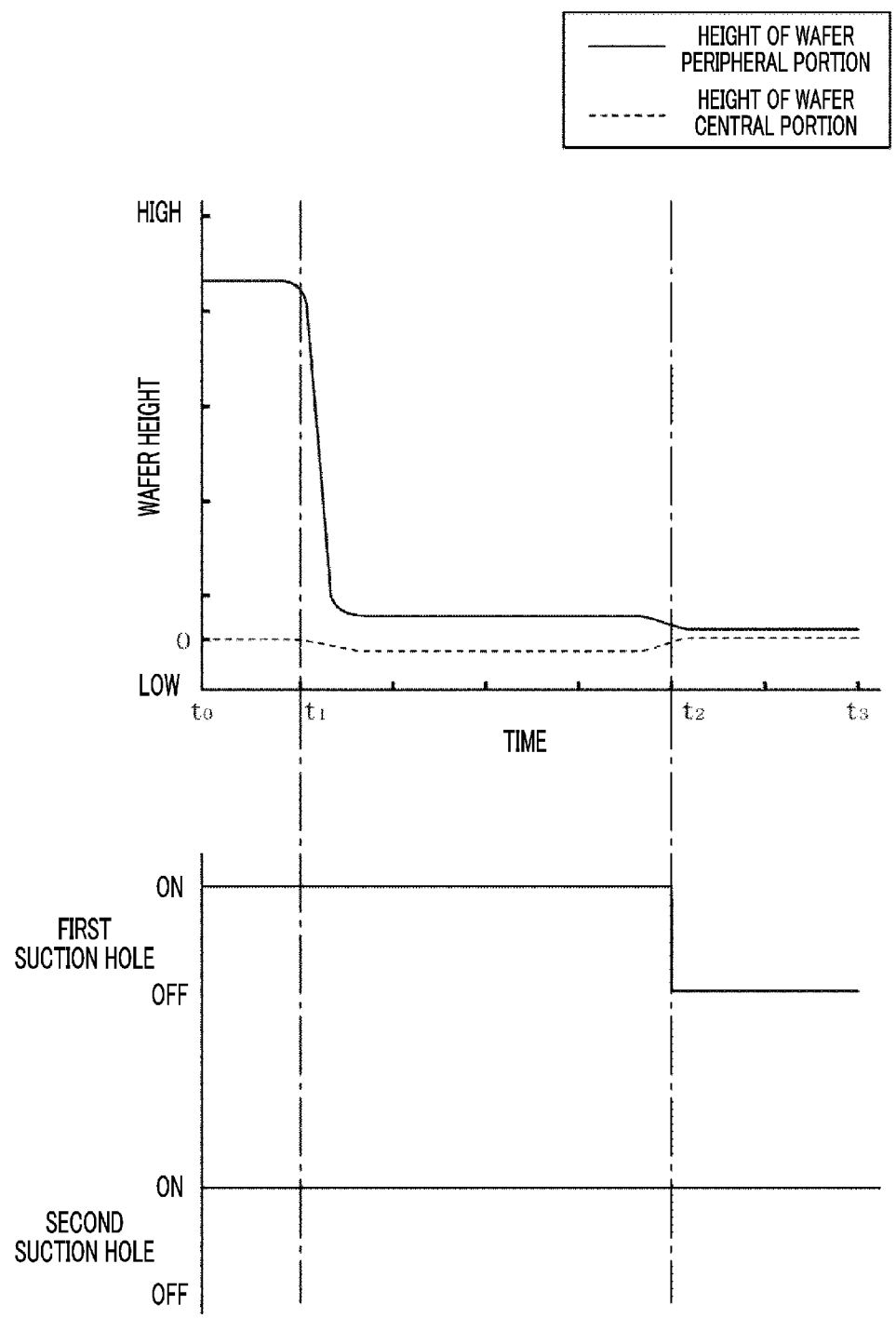
FIG. 18 is a characteristic view showing a change in a height of the wafer with a lapse of time.

An upper diagram of FIG. 18 presents an experiment result and is a characteristic view showing the variations in the height positions of the peripheral portion and the central portion of the wafer W with a lapse of time. A middle diagram and a lower diagram thereof indicate time charts illustrating the on/off operation of the suction from the first suction holes 11 and the second suction holes 12, respectively.

As can be seen from FIG. 18, with regard to the wafer W used in this example, the height position of the peripheral portion of the wafer W is higher than the height position of the central portion of the wafer W at the time $t_0$ before the wafer W is placed on the placing table 20. Then, if the wafer W is placed on the placing table 20 at the time $t_1$ and the bottom surface of the wafer W is suctioned by the first and second suction holes 11 and 12, the height position of the peripheral portion of the wafer W is lowered. That is, the bending amount of the peripheral portion of the wafer W is reduced. However, the height position of the central portion of the wafer W is also lowered. In this period from the time $t_1$ to the time $t_2$, the wafer W is found to be distorted in a wave shape.

Further, as a result of stopping the suction from the first suction holes 11 at the time $t_2$ while carrying on the suction from the second suction holes 12, the height position of the central portion of the wafer W is increased, so that the height positions of the peripheral portion and the central portion of the wafer W become same. At this time, the deformation of the wafer W is also found to be corrected. After the time $t_2$, while the suction is performed only from the second suction holes 12 until the time $t_3$, the state in which the height position of the peripheral portion of the wafer W and the height position of the central portion of the wafer W are on a level with each other is maintained, so that the wafer W is kept flattened.

Thus, according to the exemplary embodiment of the present disclosure, it is possible to place the wafer W on the placing table 20 while flattening the wafer W and suppressing the bending of the wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate placing apparatus, comprising:
a placing table configured to place a substrate thereon;
multiple protrusions provided on a surface of the placing table and configured to support the substrate;
a suction hole opened at a position on the surface of the placing table different from positions where the multiple protrusions are provided, and configured to attract a bottom surface of the substrate placed on the placing table; and
a control unit configured to output a control signal to allow a first process of attracting the substrate, which is placed on the placing table, to the placing table by performing a suction from the suction hole and a second process of attracting the substrate to the placing table by setting a suction force acting on the substrate to be smaller than a suction force acting on the substrate in the first process to be performed,
wherein the suction hole includes a first suction hole and a second suction hole configured to independently perform the suction on a first region and a second region, which are different from each other, on the bottom surface of the substrate placed on the placing table,
in the first process, the first region and the second region of the substrate placed on the placing table are attracted to the placing table such that the substrate is distorted by the suction through the first suction hole and the second suction hole, and
in the second process, the suction is performed on the second region and the substrate is attracted to the placing table and the distortion of the substrate is corrected by setting the suction force acting on the first region to be smaller than the suction force acting on the first region during the first process.

2. The substrate placing apparatus of claim 1, wherein, in the second process, the suction force acting on the first region is reduced to be smaller than the suction force acting on the second region.

3. The substrate placing apparatus of claim 2, wherein the suction is performed from the first suction hole and the second suction hole individually such that the first region and the second region are arranged along a circumference of the substrate.

4. The substrate placing apparatus of claim 3,
wherein the first region and the second region are concentric regions centered around a center of the substrate, and the suction is performed from the first suction hole and the second suction hole individually such that the first region is located closer to the center of the substrate than the second region is.

5. The substrate placing table of claim 4,
wherein the suction from the first suction hole is performed such that the first region is a region between a position distanced away from the center of the substrate by ⅓ of a radius of the substrate and a position distanced away from the center of the substrate by ⅔ of the radius of the substrate.

6. The substrate placing table of claim 1,
wherein the placing table is equipped with a temperature control unit configured to adjust a temperature of the substrate placed on the placing table.

7. A substrate placing method, comprising:
placing a substrate on a placing table having multiple protrusions configured to support the substrate;
attracting a bottom surface of the substrate placed on the placing table by performing a suction from a suction hole opened at a position on a surface of the placing table different from positions where the multiple protrusions are provided; and
attracting the substrate to the placing table by setting a suction force acting on the substrate to be smaller than a suction force acting on the substrate in the attracting of the bottom surface of the substrate,
wherein the suction hole includes a first suction hole and a second suction hole configured to independently perform the suction on a first region and a second region, which are different from each other, on the bottom surface of the substrate placed on the placing table,
in the attracting of the bottom surface of the substrate, the substrate is distorted by the suction from the first suction hole and the second suction hole, and
in the attracting of the substrate, the distortion of the substrate is corrected by setting the suction force acting on the first region to be smaller than the suction force used when attracting the bottom surface of the substrate.

8. The substrate placing method of claim 7,
wherein the attracting of the substrate comprises setting the suction force attracting the first region to be smaller than the suction force attracting the second region.

9. The substrate placing method of claim 8, further comprising:
performing the suction from the first suction hole and the second suction hole individually such that the first region and the second region are arranged along a circumference of the substrate.

10. The substrate placing method of claim 9, further comprising:
performing the suction from the first suction hole and the second suction hole individually such that the first region and the second region are concentric regions centered around a center of the substrate and the first region is located closer to the center of the substrate than the second region is.

11. The substrate placing method of claim 10, further comprising:
performing the suction from the first suction hole such that the first region is a region between a position distanced away from the center of the substrate by ⅓ of a radius of the substrate and a position distanced away from the center of the substrate by ⅔ of the radius of the substrate.

12. The substrate placing method of claim 7, further comprising:
performing a temperature adjustment of the substrate placed on the placing table.

\* \* \* \* \*

UNITED STATES PATENT AND TRADEMARK OFFICE
CERTIFICATE OF CORRECTION

PATENT NO. : 11,049,758 B2
APPLICATION NO. : 16/390079
DATED : June 29, 2021
INVENTOR(S) : Koji Ushimaru et al.

It is certified that error appears in the above-identified patent and that said Letters Patent is hereby corrected as shown below:

In the Specification

Column 9, Line 34, "2008" should be -- 200B --.

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*